(12) United States Patent  
Sun

(10) Patent No.: US 8,089,759 B2  
(45) Date of Patent: Jan. 3, 2012

(54) FASTENER FOR SECURING ELECTRONIC DEVICE AND COMPUTER UTILIZING THE SAME

(75) Inventor: Zheng-Heng Sun, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 183 days.

(21) Appl. No.: 12/722,550

(22) Filed: Mar. 12, 2010

(65) Prior Publication Data

US 2011/0122577 A1　May 26, 2011

(30) Foreign Application Priority Data

Nov. 23, 2009　(CN) .......................... 2009 1 0310206

(51) Int. Cl.
*H05K 5/00* (2006.01)
*H05K 7/00* (2006.01)
(52) U.S. Cl. ......... 361/679.58; 361/679.33; 361/679.37; 361/679.38; 361/679.39
(58) Field of Classification Search ............. 361/679.33, 361/679.37, 679.38, 679.39, 679.58
See application file for complete search history.

(56) References Cited

U.S. PATENT DOCUMENTS

| | | | | |
|---|---|---|---|---|
| 6,305,660 B1 * | 10/2001 | Liao | ............................... | 248/694 |
| 6,543,866 B2 * | 4/2003 | Chen et al. | ................. | 312/223.2 |
| 6,917,520 B2 * | 7/2005 | Lin et al. | ................... | 361/679.35 |
| 7,038,907 B2 * | 5/2006 | Chen | ......................... | 361/679.33 |
| 7,259,959 B2 * | 8/2007 | Tu et al. | .................... | 361/679.33 |
| 7,543,786 B2 * | 6/2009 | Yang | ......................... | 248/222.51 |
| 7,656,654 B2 * | 2/2010 | Liu et al. | .................. | 361/679.33 |
| 7,755,886 B2 * | 7/2010 | Peng et al. | ............... | 361/679.33 |

* cited by examiner

*Primary Examiner* — Anthony Haughton
(74) *Attorney, Agent, or Firm* — Altis Law Group, Inc.

(57) ABSTRACT

A fastener for mounting an electronic device in a computer includes a cap, a sleeve, a spring, and a mounting post. The cap is mounted to the sleeve. The sleeve defines a receiving aperture and a passage hole therein. The mounting post includes a torsion portion and a wedge portion at opposite ends thereof. The wedge portion is provided with an angled surface. A blocking ring is formed between the torsion portion and the wedge portion. The torsion portion extends into the cap. The spring is disposed around the torsion portion. The spring and the blocking ring are received in the receiving aperture of the sleeve, and the wedge portion extends out of the sleeve from the passage hole. The torsion portion rotates commensurately when the cap is rotated to adjust an orientation of the angled surface of the wedge portion.

20 Claims, 7 Drawing Sheets

FASTENER FOR SECURING ELECTRONIC DEVICE AND COMPUTER UTILIZING THE SAME

BACKGROUND

1. Technical Field

The disclosure generally relates to device deployment, and particularly to a fastener for mounting an electronic device in a computer, and a computer utilizing the fastener.

2. Description of Related Art

Often, a computer assembly includes a computer case and a plurality of electronic devices such as disk drives secured therein. The electronic devices are secured on a frame accommodated in the computer case via a plurality of fasteners, such as screws. To install the screws on the frame, a screwdriver is often needed. However, with the trends in information technology, computer cases are built with increasingly reduced size and volume, with inner space thereof decreasing commensurately, causing increasing likelihood of interference between the screwdriver being used for installing a device and inner structures of the computer case, rendering installation and removal of the electronic devices highly inconvenient.

Accordingly, what is needed is a fastener for mounting an electronic device in a computer which can overcome the described limitations.

DETAILED DESCRIPTION

Figure 1:
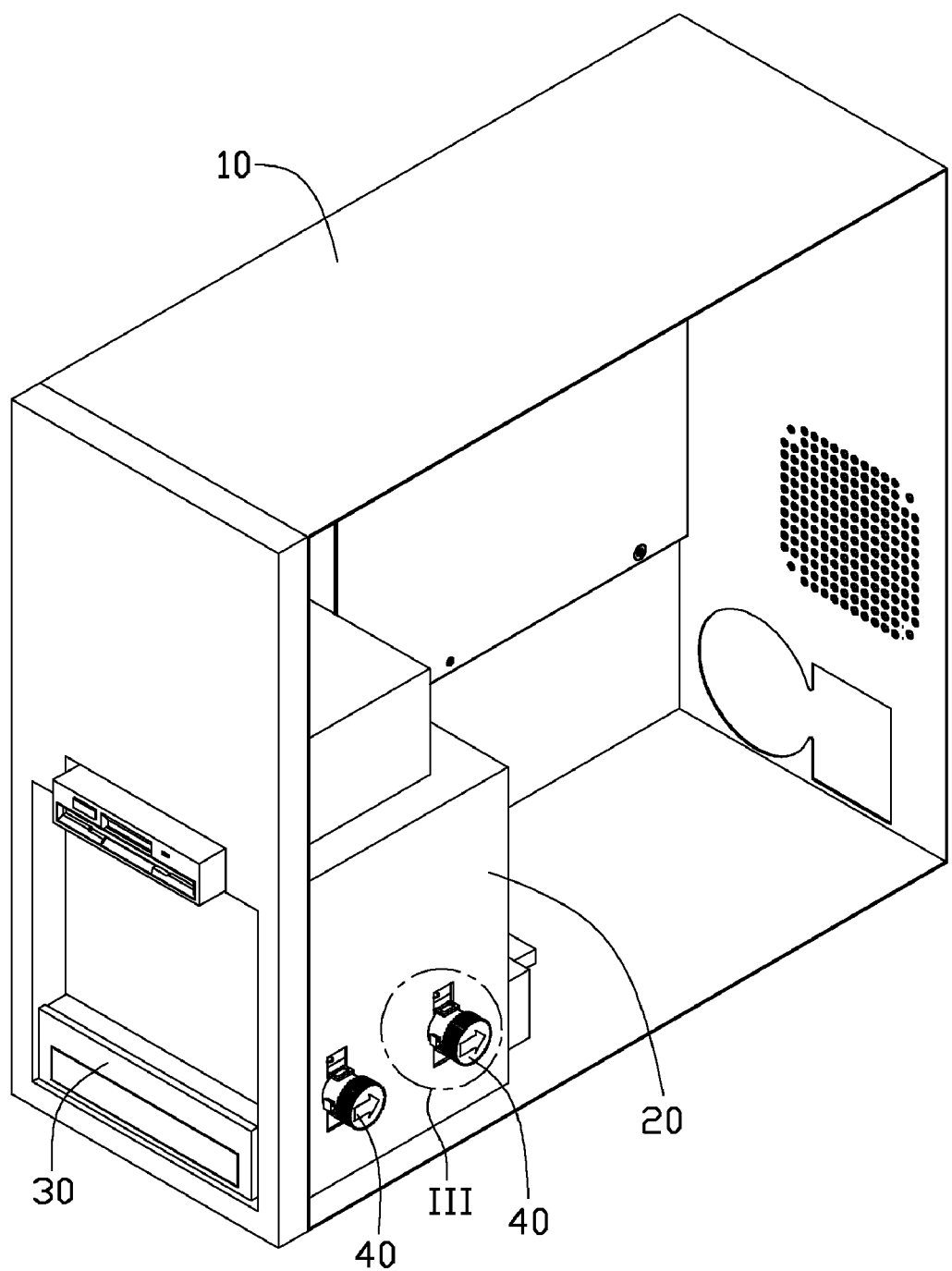
FIG. 1 is an isometric, assembled view of a computer in accordance with an exemplary embodiment of the present disclosure.

Referring to FIG. 1, a computer according to an exemplary embodiment of the present disclosure is shown. The computer includes a computer case 10, a frame 20 accommodated in the computer case 10, and an electronic device 30 secured in the frame 20. In the FIG. 1, a right plate (not shown) of the computer case 10 is removed for clarity. The electronic device 30 may be a disk drive or a power converter. In this embodiment, the electronic device 30 is a hard disk drive. The electronic device 30 is secured in the frame via two fasteners 40.

Figure 2:
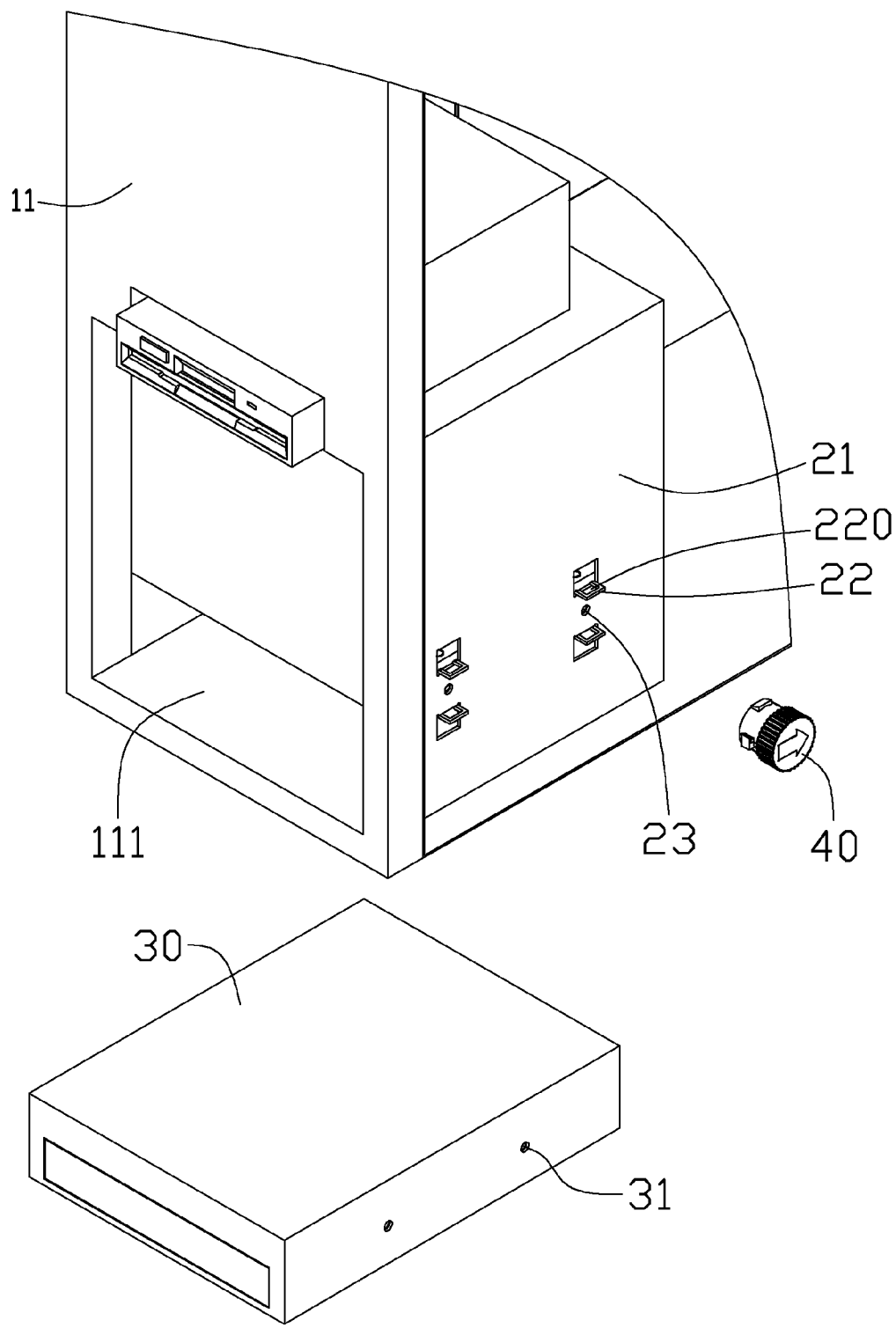
FIG. 2 is a partial, exploded view of the computer of FIG. 1.

Referring to FIG. 2, the computer case 10 is cuboid and hollow, and provided with a front plate 11 at a front thereof. An access port 111 is defined in the front plate 11 for receiving the electronic device 30 into the computer case 10. The frame 20 is disposed adjacent to the front plate 11 in the computer case 10. The frame 20 includes two securing plates 21 at opposite sides thereof. The two securing plates 21 are parallel to and spaced from each other, with one at a left side of the computer case 10, and the other at a right side of the computer case 10. The electronic device 30 is received in the frame 20 through the access port 111 of the computer case 10, and fixed between the two securing plates 21 of the frame 20. Two pairs of securing ears 22 protrude outwardly from the right side securing plate 21 of the frame 20. Each of the securing ears 22 defines a securing hole 220 therein. A through hole 23 is defined in the right side securing plate 21 between each pair of securing ears 22. Two receiving holes 31 are defined in one side of the electronic device 30, corresponding to the through holes 23 of the right side securing plate 21 of the frame 20. Each of the receiving holes 31 of the electronic device is aligned with a corresponding through hole 23 of the right side securing plate 21 of the frame 20. Each of the two fasteners 40 is secured between one of the two pairs of securing ears 22 and the electronic device 30 is secured in the frame 20 via the fasteners 40.

Figure 3:
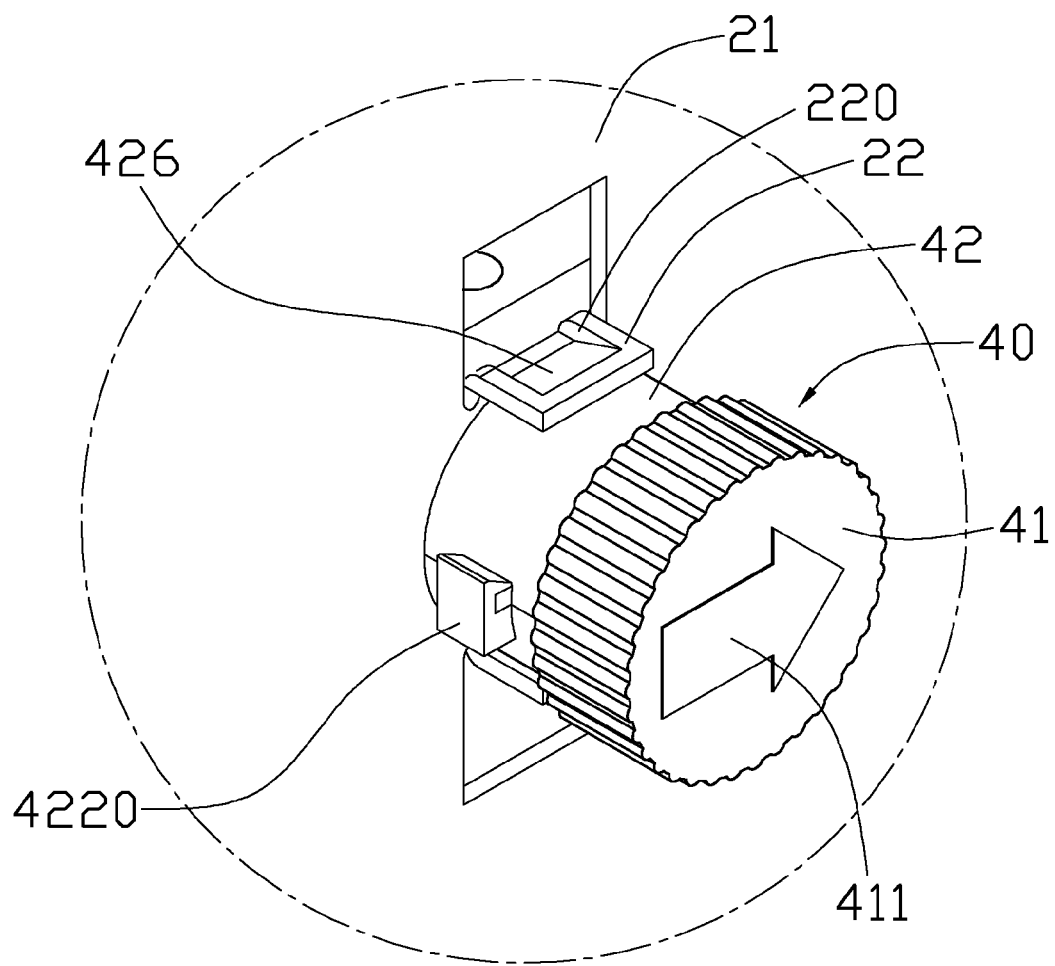
FIG. 3 is an enlarged view of the circled portion III of FIG. 1.
Figure 4:
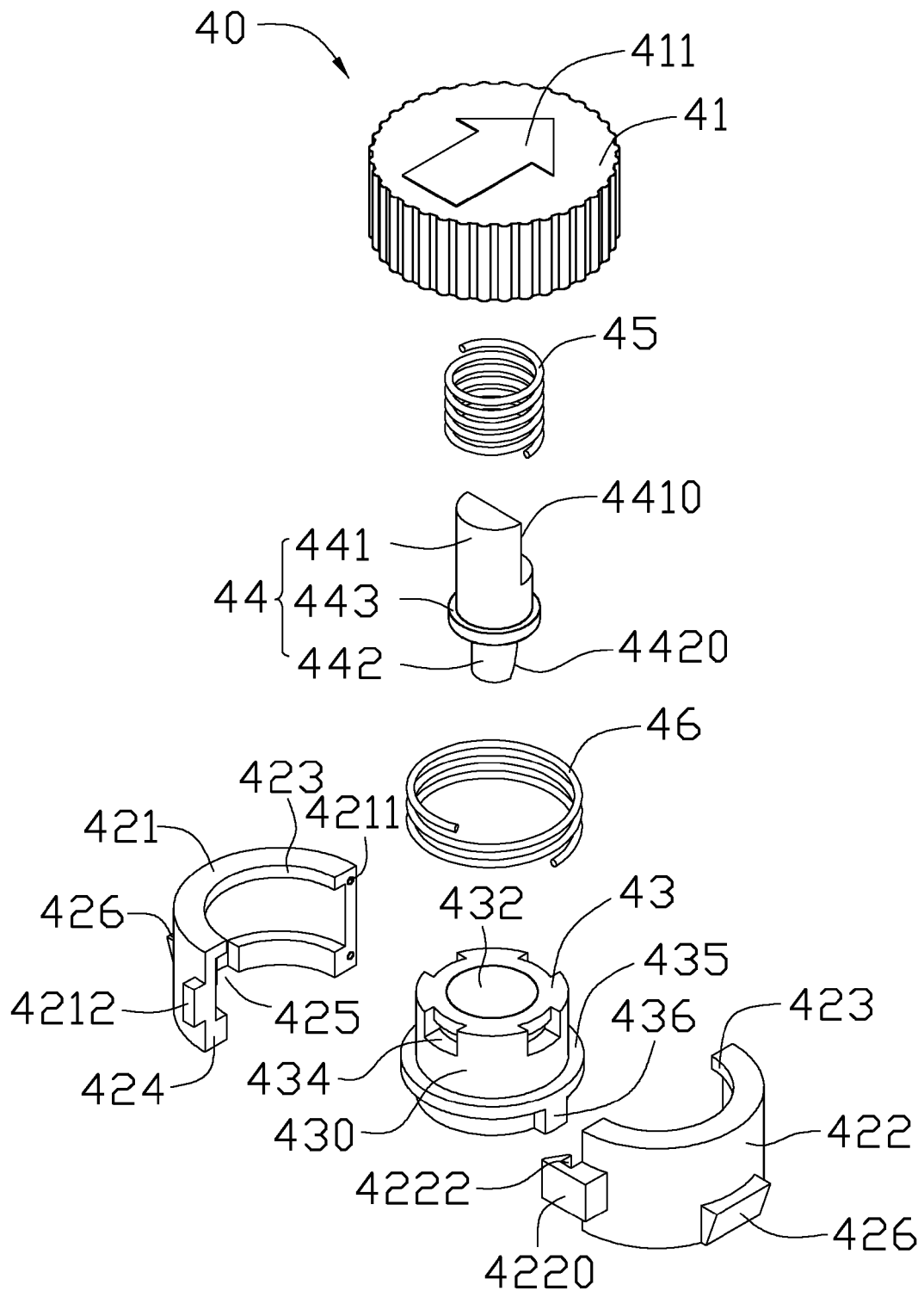
FIG. 4 is an exploded view of a fastener of FIG. 2, in accordance with an exemplary embodiment of the present disclosure.
Figure 5:
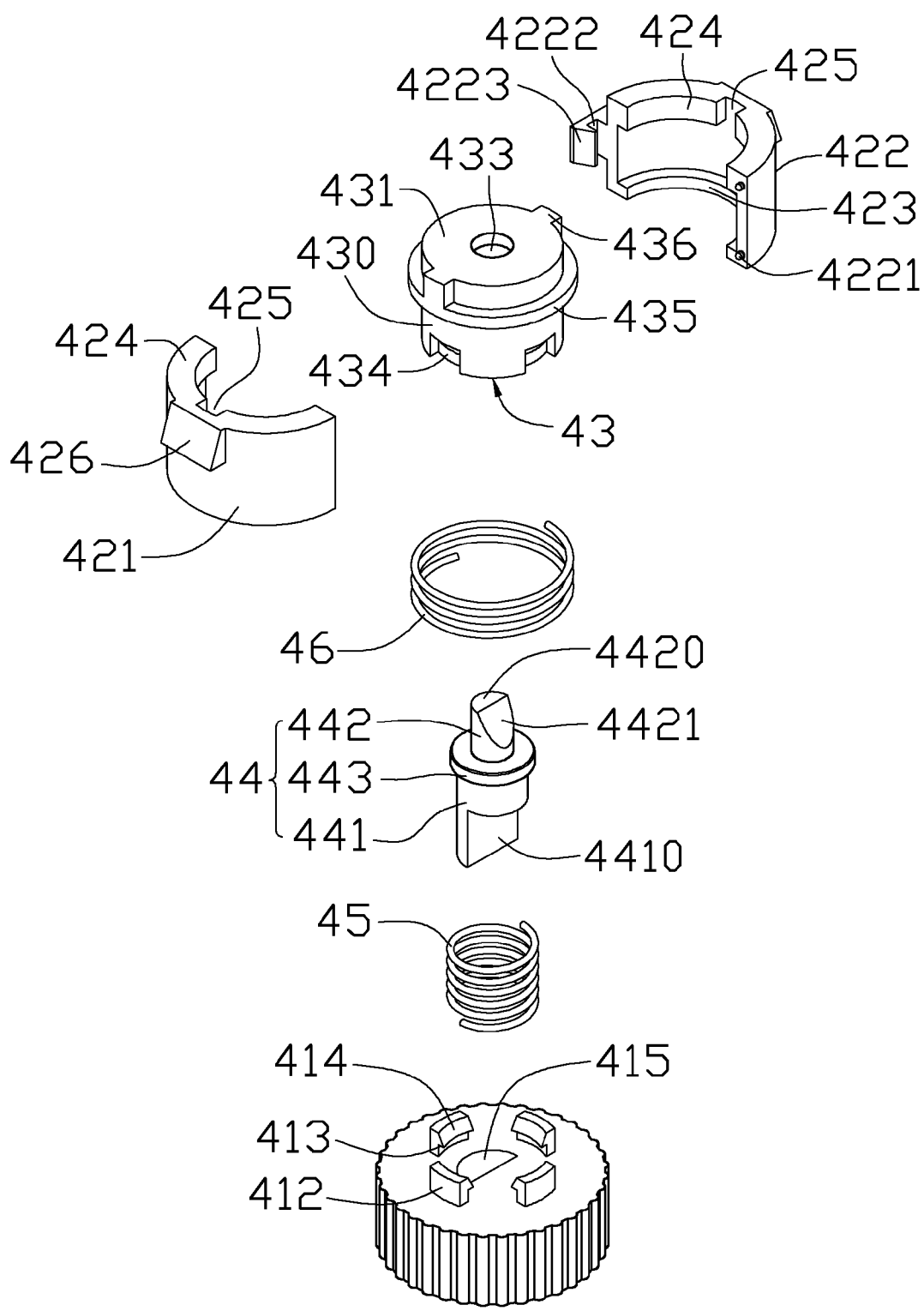
FIG. 5 is another exploded view of the fastener of FIG. 2, viewed from a different aspect.

Referring to FIGS. 3-5, each fastener 40 includes a cap 41, a seat 42 adjacent to the cap 41, a sleeve 43 connected to a bottom surface of the cap 41 and received in the seat 42, a mounting post 44 received in the sleeve 43, a first spring 45 coiled around the mounting post 44, and a second spring 46 coiled around the sleeve 43.

The cap 41 is disk-shaped. A mark 411 is formed on a top surface of the cap 41. In this embodiment, the mark 411 is an arrowhead formed on the top surface of the cap 41. Four securing claws 412 protrude downwardly from a bottom surface of the cap 41. The securing claws 412 are homocentric and evenly spaced from each other. A hook portion 413 protrudes inwardly from a free end of each of the securing claws 412. An angled guiding surface 414 is formed at a bottom of each of the hook portions 412 facilitating mounting of the cap 41 to the sleeve 43. A receiving groove 415 defined in a central portion of the bottom surface of the cap 41 is semi-circular. The receiving groove 415 is a blind hole and does not extend through the top surface of the cap 41. The securing claws 412 are arranged around the receiving groove 415.

The seat 42 is tubular, and includes a first half 421 and a second half 422. The first half 421 and the second half 422 each are substantially semi-circular in cross-section. The first half 421 and the second half 422 engage each other and cooperatively form the seat 42.

A top flange 423 protrudes inwardly from a top of each one of the first half 421 and the second half 422. A bottom flange 424 protrudes inwardly from a bottom of each one of the first half 421 and the second half 422. A positioning cutout 425 is defined in the second flange 424 of each of the first half 421 and the second half 422. The positioning cutout 425 divides the second flange 424 into two sections. A securing block 426 protrudes outwardly from an outer surface of each one of the first half 421 and the second half 422. The securing block 426 is wedge-shaped. In a circumferential direction of the seat 42, two opposite lateral sides of the first half 421 respectively engage two opposite lateral sides of the second half 422. One of the two lateral sides of the first half 421 defines two receiving grooves 4211 therein. The two receiving grooves 4211 face the second half 422. The two receiving grooves 4211 are respectively located adjacent to the first flange 423 and the second flange 424 of the first half 421. An engaging ear 4212 protrudes outwardly along a radial direction of the first half 421 from a middle portion of the other of the two lateral sides of the first half 421. The engaging ear 4212 is longitudinal along an axis of the first half 421.

The second half 422 has a structure similar to the first half 421, differing only in that two engaging nubs 4221 protrude outwardly from one of the two lateral sides of the second half 422 corresponding to the two receiving grooves 4211 of the first half 421, and a latching portion 4220 is formed at a middle portion of the other of the two lateral sides of the second half 422 corresponding to the engaging ear 4212 of the first half 421. The latching portion 4220 extends from the second half 422 towards the first half 421. An receiving recess 4222 is defined in an inner side of the latching portion 4220, receiving the engaging ear 4212 of the first half 421. An inclined surface 4223 is formed at a free end of the latching portion 4220 for guiding the engaging ear 4212 to slide into the receiving recess 4222 of the latching portion 4220.

The securing blocks 426 of the first half 421 and the second half 422 are symmetrical relative to a longitudinal axis of the seat 42. The securing blocks 426 of each of the fasteners 40 are respectively received in the securing holes 220 of a corresponding pair of securing ears 22 when the fastener 40 is mounted to the frame 20.

Figure 6:
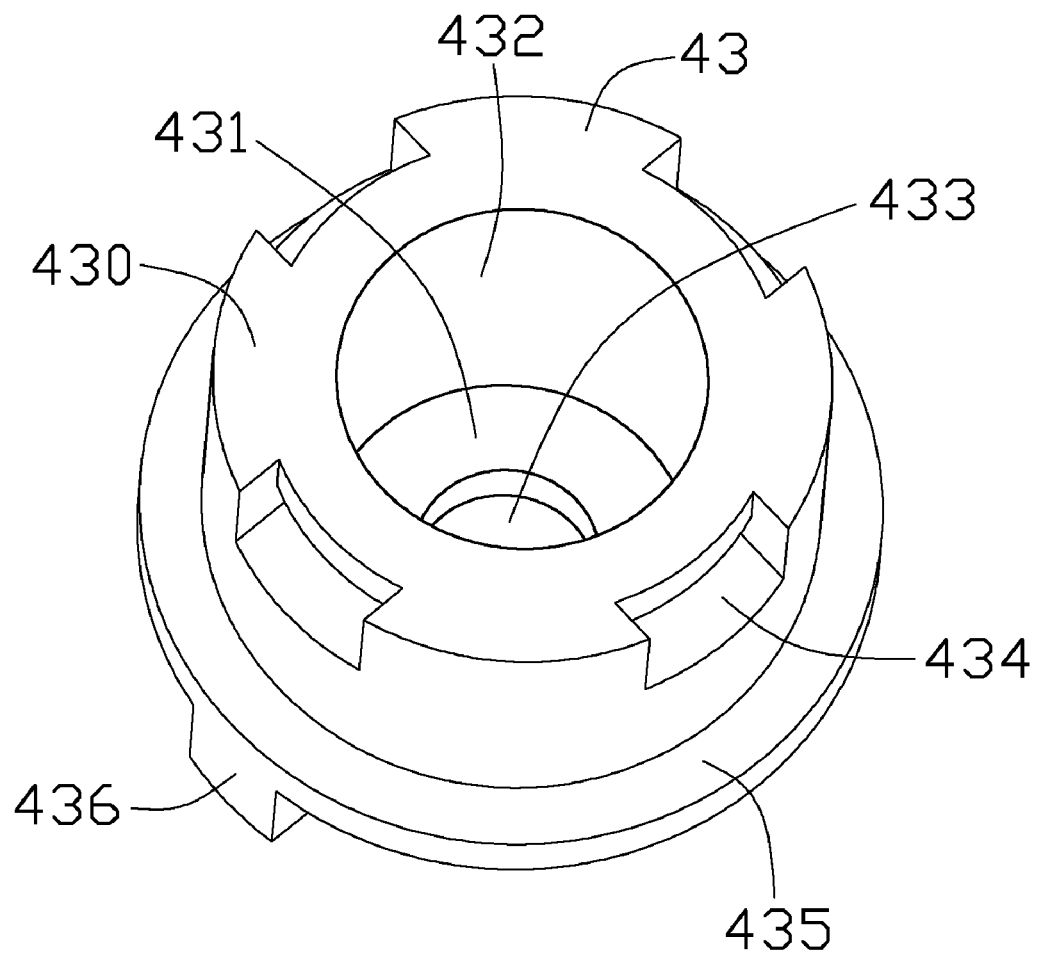
FIG. 6 is an enlarged isometric view of a sleeve of the fastener of FIG. 4, viewed from a different aspect.

Referring to the FIGS. 4-6, the sleeve 43 is tubular and includes a tubular body 430. A receiving aperture 432 is defined in an upper section of the body 430. A passage hole 433 is defined in a lower section of the body 430. A diameter of the receiving aperture 432 exceeds that of the passage hole 433, whereby a blocking step 431 is formed in the body 430 between the upper and lower sections of the body 430. Four receiving recesses 434 are defined in an outer surface of a top end of the body 430 corresponding to the four securing claws 412 of the cap 41. Each of the receiving recesses 434 is aligned with a corresponding securing claw 412 of the cap 41. A protruding block 4341 is formed in the receiving recess 434. An annular positioning ring 435 extends outwardly from an outer circumferential surface of a lower portion of the body 430 of the sleeve 43. Two positioning blocks 436 protrude downwardly from the positioning ring 435 along the outer circumferential surface of the body 430 of the sleeve 43. The two positioning blocks 436 correspond respectively to the two positioning cutouts 425 of the seat 42.

The second spring 45 is coiled around the body 430 of the sleeve 43 and positioned between the first flanges 423 of the seat 42 and the positioning ring 435 of the sleeve 43.

The mounting post 44 includes a first post section 441 at a top thereof, a second post section 442 at a bottom thereof and a blocking ring 443 therebetween. A diameter of the first post section 441 exceeds that of the second post section 442. The blocking ring 443 extends outwardly from a middle of an outer periphery of the mounting post 44. A diameter of the blocking ring 443 exceeds that of each of the first post section 441 and the second post section 442. A semi-columnar torsion portion 4410 is formed at a top free end of the first post section 441. A wedge portion 4420 is formed at a bottom free end of the second post section 442. The wedge portion 4420 is provided with an angled surface 4421 formed thereon. The angled surface 4421 angles on the wedge portion 4420 along a longitudinal axis of the wedge portion 4420. The mark 411 on the cap 41 designates an orientation of the angled surface 4421 of the wedge portion 4420.

Figure 7:
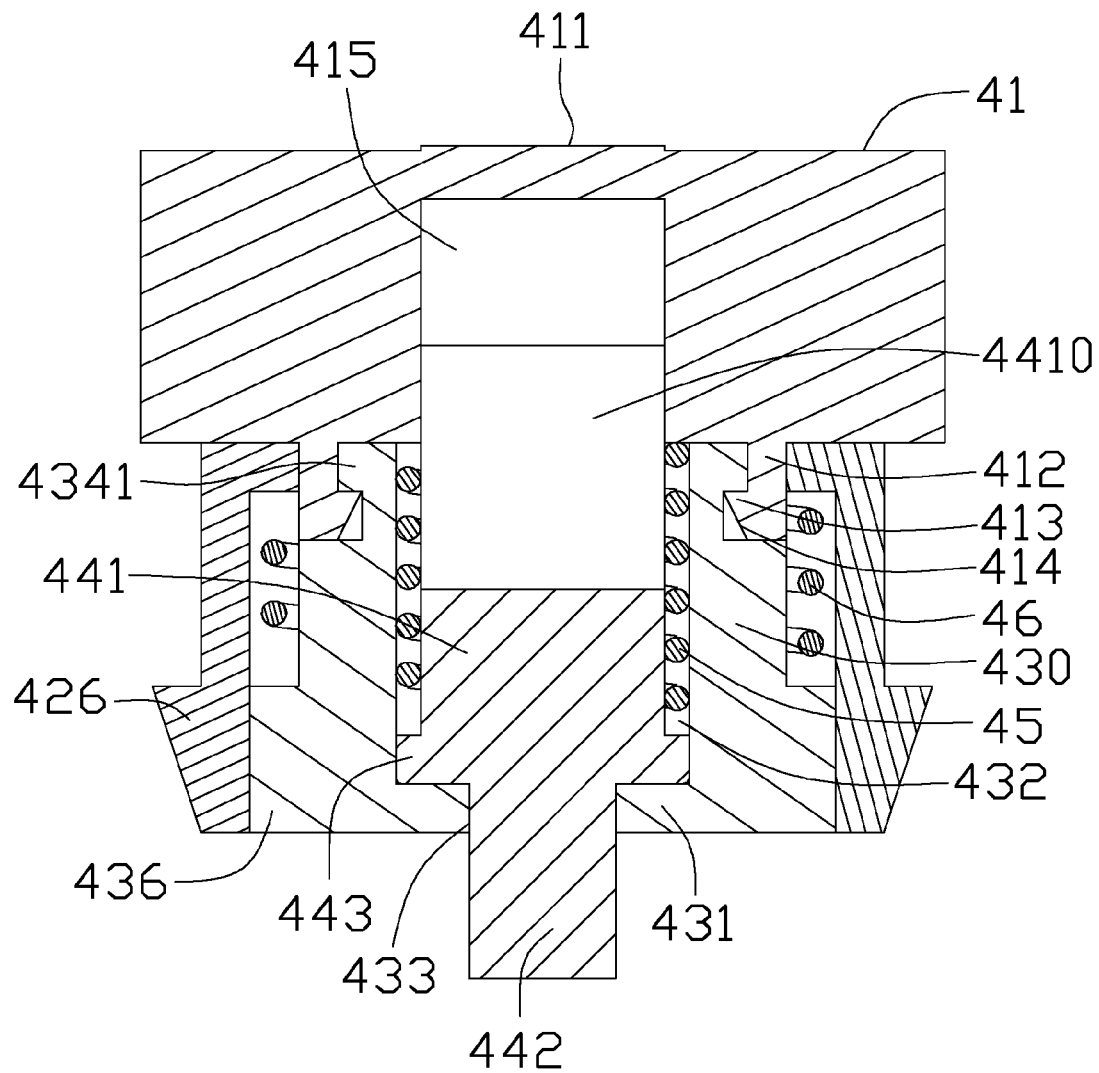
FIG. 7 is a cross-section of the fastener of FIG. 2.

Referring to FIG. 7, during assembly of the fastener 40, the first spring 45 is disposed around the first post section 441 of the mounting post 44. The first spring 45, the first post section 441 of the mounting post 44 and the blocking ring 443 of the mounting post 44 are received in the receiving aperture 432 of the sleeve 43. The second post section 442 of the mounting post 44 extends out of the sleeve 43 from the passage hole 433 of the sleeve 43, and the blocking ring 443 is blocked by the blocking step 431 of the sleeve 43. The cap 41 is secured to the sleeve 43 via the securing claws 412 of the cap 41 being received in the receiving recesses 434 of the sleeve 43. The hook portions 413 of the securing claws 412 of the cap 41 engage the protruding blocks 4341 in the receiving recesses 434 of the sleeve 43. The first spring 45 is located between the bottom surface of the cap 41 and the positioning ring 435 of the sleeve 43. The torsion portion 4410 of the mounting post 44 is received in the receiving groove 415 of the cap 41. When the cap 41 is rotated, the mounting post 44 rotates correspondingly. When an applied force moves the second post section 442 towards the cap 41, the second post section 442 slides into the receiving aperture 432 of the sleeve 43 and the first post section 441 of the mounting post 44 moves in the receiving groove 415 of the cap 41. The first spring 45 is compressed between the bottom surface of the cap 41 and the blocking ring 443 of the mounting post 44. When the force applied on the second post section 442 ceases, the second post section 442 is ejected out of the receiving aperture 432 of the sleeve 43 through the passage hole 433 by elastic force of the first spring 45.

The second spring 46 is disposed around the sleeve 43. The first half 421 and the second half 422 are assembled together to form the seat 42. The seat 42 is located under the bottom surface of the cap 41. The sleeve 43 and the second spring 46 are received in the seat 42. The second spring 46 and the positioning ring 435 of the sleeve 43 are located between the first flanges 423 and the second flanges 424 of the seat 42. The second spring 46 is located between the first flanges 423 of the seat 42 and the positioning ring 435 of the sleeve 43. The two positioning blocks 436 of the sleeve 43 are respectively received in the positioning cutouts 425 of the seat 42.

When the fastener 40 is mounted to the frame 20 of the computer, the wedge portion 4420 of the second post section 442 of the mounting post 44 aligns with and is received in the through hole 23 of the frame 20. The two securing blocks 426 of the seat 42 are secured to the two securing ears 22 of the frame 20.

Before the electronic device 30 is mounted to the frame 20, the cap 41 is rotated to adjust an orientation of the angled surface 4421 of the wedge portion 4420 of the mounting post 44. Particularly, the angled surface 4421 is adjusted to face the access port 111 of the computer case 10, wherein the cap 41 is pulled outwards, drawing sleeve 43 outwards and moveable relative to the seat 42. As the sleeve 43 moves in the seat 42, the two positioning blocks 436 of the sleeve 43 move out of the positioning cutouts 425 of the seat 42 and enter a space between the first flanges 423 and the second flanges 424 of the seat 42. Cap 41 is rotated, as is the mounting post 44, until the arrowhead mark 441 faces the access port 111 of the computer case 10.

For example, if the fastener 40 is located in an initial state as shown in FIG. 1 wherein the arrowhead of the mark 441 faces a back of the computer case 10, the cap 41 needs to be rotated 180° until the arrowhead of the mark 441 faces the access port 111 of the computer case 10. After rotation, the cap 41 is released, and elastic force of the second spring 46 impels the two positioning blocks 436 of the sleeve 43 into the positioning cutouts 425 of the seat 42 again.

After the arrowhead of the mark 441 is adjusted to face the access port 111 of the computer case 10, the electronic device 30 is received in the frame 20 via the access port 111. As the electronic device 30 is received in the frame 20, the side surface of the electronic device 30 contacts and acts on the angled surface 4421 of the wedge portion 4420 of the mounting post 44, which is moved by the electronic device 30 into the receiving aperture 432 of the sleeve 43 from the passage hole 433. When the electronic device 30 is moved into the frame 20 and the receiving holes 31 of the electronic device 30 aligns with the through holes 23 of the frame 20, the wedge portion 4420 of the mounting post 44 of each fastener 40 is ejected into the corresponding receiving hole 31 of the electronic device 30 by the first spring 45. Thus, the electronic device 30 is secured in the frame 20 by the fasteners 40. At this stage, since the angled surface 4421 of the wedge portion 4420 is oriented towards the access port 111 of the computer case 10, the electronic device 30 is prevented from withdrawing from the frame 20.

When the electronic device 30 is to be removed from the frame 20, the cap 41 is rotated 180° such that the angled surface 4421 of the wedge portion 4420 is oriented to the back of the computer case 10. The electronic device 30 can accordingly be easily removed from the frame 20.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for mounting an electronic device in a computer, comprising:
    a cap defining a receiving groove therein;
    a sleeve connected to the cap, the sleeve defining a receiving aperture and a passage hole therein;
    a mounting post comprising a torsion portion and a wedge portion at two opposite ends thereof, the wedge portion comprising an angled surface formed thereon, a blocking ring provided between the torsion portion and the wedge portion, a diameter of the blocking ring exceeding that of the passage hole of the sleeve; and
    a spring disposed around the torsion portion of the mounting post and located between the cap and the blocking ring, wherein the spring and the blocking ring of the mounting post are received in the receiving aperture of the sleeve, the torsion portion of the mounting post extends into the receiving groove of the cap, and the wedge portion extends out of the sleeve from the passage hole;
    wherein when the cap is rotated, the torsion portion rotates commensurately to adjust an orientation of the angled surface of the wedge portion; and
    wherein when a force acts on the angled surface of the wedge portion of the mounting post, the wedge portion of the mounting post slides into the receiving aperture of the sleeve, and when the force ceases, the wedge portion of the mounting portion is ejected out of the sleeve through the passage hole under an elastic force of the spring.

2. The fastener of claim 1, wherein a diameter of the receiving aperture exceeds that of the passage hole, a positioning step is formed between the receiving aperture and the passage hole, and the blocking ring abuts the positioning step.

3. The fastener of claim 1, wherein the receiving groove of the cap is a blind hole of semi-circular shape, and the torsion portion is semi-columnar.

4. The fastener of claim 1, wherein the cap is provided with a mark indicating an orientation of the angled surface of the wedge portion of the mounting post.

5. The fastener of claim 1, wherein the cap is provided with a plurality of securing claws and the sleeve is defined with a plurality of receiving recesses receiving the securing claws to connect the cap to the sleeve.

6. The fastener of claim 1, further comprising a tubular seat in which the sleeve is received.

7. The fastener of claim 6, further comprising another spring disposed around the sleeve.

8. The fastener of claim 7, wherein the seat comprises a top flange and a bottom flange, an annular positioning ring extends outwardly from an outer circumferential surface of the sleeve, the positioning ring is located between the top flange and the bottom flange, and the other spring is located between the top flange and the positioning ring.

9. The fastener of claim 8, wherein the bottom flange is defined with a plurality of positioning cutouts, the sleeve is provided with a plurality of positioning blocks at an outer circumferential surface thereof, and the positioning blocks are respectively received in the positioning cutouts.

10. The fastener of claim 6, wherein the seat comprises a first half and a second half, both semi-circular, and the first half and the second half engage to cooperatively form the seat.

11. A computer, comprising:
    a computer case;
    a frame mounted in the computer case; and
    an electronic device mounted in the frame by at least one fastener, wherein at least one receiving hole is defined in the electronic device, each of the at least one fastener comprising:
        a cap defining a receiving groove therein;
        a sleeve connected to the cap, the sleeve defining a receiving aperture and a passage hole therein;
        a mounting post comprising a torsion portion and a wedge portion at two opposite ends thereof, the wedge portion comprising an angled surface formed thereon, a blocking ring provided between the torsion portion and the wedge portion, the blocking ring of a diameter exceeding that of the passage hole of the sleeve; and
        a spring disposed around the torsion portion of the mounting post and between the cap and the blocking ring, wherein the spring and the blocking ring of the mounting post are received in the receiving aperture of the sleeve, the torsion portion of the mounting post is received in the receiving groove of the cap, and the wedge portion extends out of the sleeve from the passage hole;
    wherein when the cap is rotated, the torsion portion rotates commensurately to adjust an orientation of the angled surface of the wedge portion; and
    wherein when the electronic device provides a force on the angled surface of the wedge portion of the mounting post, the wedge portion of the mounting post withdraws in the receiving aperture of the sleeve, and when force ceases on the angled surface of the wedge portion, the wedge portion of the mounting portion is ejected out of the sleeve through the passage hole under elastic force of the spring and received in one of the at least one receiving hole of the electronic device.

12. The computer of claim 11, wherein the receiving aperture is of a diameter exceeding that of the passage hole, a positioning step is formed between the receiving aperture and the passage hole, and the blocking ring abuts the positioning step.

13. The computer of claim 11, wherein the receiving groove of the cap is a blind hole and is semi-circular, and the torsion portion is semi-columnar.

14. The computer of claim 11, wherein the cap is provided with a mark indicating an orientation of the angled surface of the wedge portion of the mounting post.

15. The computer of claim 11, wherein the cap is provided with a plurality of securing claws and the sleeve is defined with a plurality of receiving recesses in which the securing claws are received to connect the cap to the sleeve.

16. The computer of claim 11, further comprising a tubular seat in which the sleeve is received.

17. The computer of claim 16, further comprising another spring disposed around the sleeve.

18. The computer of claim 17, wherein the seat comprises a top flange and a bottom flange, an annular positioning ring extends outwardly from an outer circumferential surface of the sleeve, the positioning ring is located between the top flange and the bottom flange, and the other spring is located between the top flange and the positioning ring.

19. The computer of claim 18, wherein the bottom flange defines a plurality of positioning cutouts, the sleeve is provided with a plurality of positioning blocks from an outer circumferential surface thereof, and the positioning blocks are respectively received in the positioning cutouts.

20. The computer of claim 16, wherein the seat comprises a first half and a second half, both of which are semi-circular, and which engage to cooperatively form the seat.

* * * * *